United States Patent
Radziemski et al.

(10) Patent No.: US 6,737,789 B2
(45) Date of Patent: May 18, 2004

(54) FORCE ACTIVATED, PIEZOELECTRIC, ELECTRICITY GENERATION, STORAGE, CONDITIONING AND SUPPLY APPARATUS AND METHODS

(76) Inventors: Leon J. Radziemski, 5153 N. Via Velazquez, Tucson, AZ (US) 85750; Kelvin G. Lynn, SE. 780 Glenwood Ct., Pullman, WA (US) 99163

(*) Notice: Subject to any disclaimer, the term of this patent is extended or adjusted under 35 U.S.C. 154(b) by 0 days.

(21) Appl. No.: 10/308,358

(22) Filed: Dec. 2, 2002

(65) Prior Publication Data

US 2003/0137221 A1 Jul. 24, 2003

Related U.S. Application Data

(60) Provisional application No. 60/350,396, filed on Jan. 18, 2002, and provisional application No. 60/350,428, filed on Jan. 18, 2002.

(51) Int. Cl.[7] .............................................. H01L 41/04
(52) U.S. Cl. .................................... 310/339; 310/319
(58) Field of Search ................................. 310/319, 339

(56) References Cited

U.S. PATENT DOCUMENTS

| | | | | |
|---|---|---|---|---|
| 4,160,234 A | * | 7/1979 | Karbo et al. ................. 310/338 |
| 4,748,366 A | | 5/1988 | Taylor ........................ 310/328 |
| 5,237,239 A | * | 8/1993 | Inoue et al. ................. 310/328 |
| 5,239,518 A | * | 8/1993 | Kazmar ...................... 310/337 |
| 5,376,857 A | * | 12/1994 | Takeuchi et al. ............ 310/328 |
| 5,494,468 A | | 2/1996 | Demarco, Jr. ................ 441/64 |
| 5,585,546 A | * | 12/1996 | Gururaja et al. ............. 73/1.82 |
| 5,629,678 A | | 5/1997 | Gargano et al. ............. 340/573 |
| 5,671,746 A | * | 9/1997 | Dreschel et al. ............ 600/472 |
| 5,703,474 A | | 12/1997 | Smalser ...................... 323/299 |
| 5,751,091 A | | 5/1998 | Takahashi et al. ........... 310/339 |
| 5,788,453 A | * | 8/1998 | Donde et al. ............... 414/744.5 |
| 5,835,996 A | | 11/1998 | Hashimoto et al. .......... 323/364 |
| 5,918,502 A | | 7/1999 | Bishop ......................... 73/172 |
| 5,925,972 A | * | 7/1999 | Shrader et al. .............. 310/338 |
| 5,998,910 A | | 12/1999 | Park et al. ................... 310/358 |
| 6,196,932 B1 | * | 3/2001 | Marsh et al. ................ 310/318 |
| 6,201,336 B1 | | 3/2001 | Burns ......................... 310/319 |

(List continued on next page.)

FOREIGN PATENT DOCUMENTS

FR     2616335 A  * 12/1988 ........... A63B/43/00

OTHER PUBLICATIONS

J.S. Yang et al., "Extensional vibration of a nonuniform piezoceramic rod and high voltage generation", International Journal of Applied Electromagnetics and Mechanics IOS Press, 2000, seven pages.

Park et al, "Crystal Growth and Ferroelectric Related Properties of $(1-x)$ $Pb(A_{1/3}Nb_{2/3})O_3-x$ $PbTiO_3$ $(A=Zn^{2+}, Mg^{2+})$", IEEE, 1996, pp. 79–82.

(List continued on next page.)

*Primary Examiner*—Burton S. Mullins
*Assistant Examiner*—J. Aguirrechea
(74) *Attorney, Agent, or Firm*—Randy A. Gregory; Gregory I.P. Law

(57) ABSTRACT

A force activated electrical power generator is provided using piezoelectric elements of preferred lead-magnesium-niobate lead titanate (PMN-PT). The circuitry is in preferred versions completely passive generating all power needed. Some circuitry limits voltage across the elements and provides a return charge channel to prevent depolarization. Transformers can be used to increase the output voltage and efficiency. Rectifiers are shown to rectify the output to a single polarity. Filtering, regulation and other conditioning components are also shown. The output from the generator and circuitry can store the electrical charge, such as in a capacitor and/or battery.

7 Claims, 6 Drawing Sheets

U.S. PATENT DOCUMENTS

| | | | |
|---|---|---|---|
| 6,215,733 B1 * | 4/2001 | Rynne et al. | 367/137 |
| 6,224,493 B1 * | 5/2001 | Lee et al. | 473/226 |
| 6,407,484 B1 * | 6/2002 | Oliver et al. | 310/339 |
| 6,424,079 B1 | 7/2002 | Carroll | 310/339 |
| 6,433,465 B1 * | 8/2002 | McKnight et al. | 310/339 |
| 2001/0032663 A1 | 10/2001 | Pelrine et al. | 136/205 |
| 2001/0035723 A1 | 11/2001 | Pelrine et al. | 318/116 |

OTHER PUBLICATIONS

"Material properties of PZN–8% PT Single Crystal", PennState, 1 page.

"Material properties of PMN–33% PT Single Crystal", PennState, 1 page.

* cited by examiner

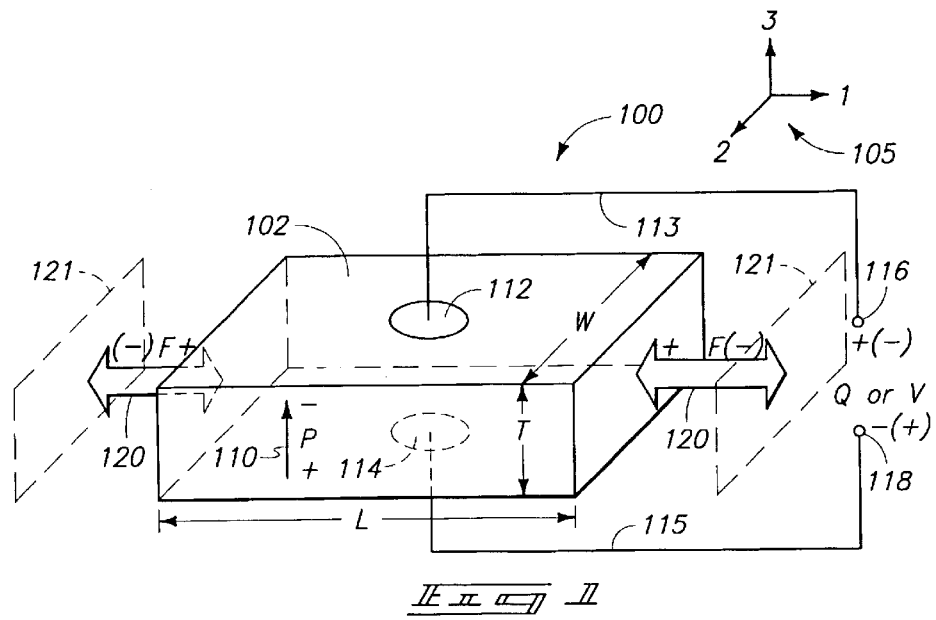
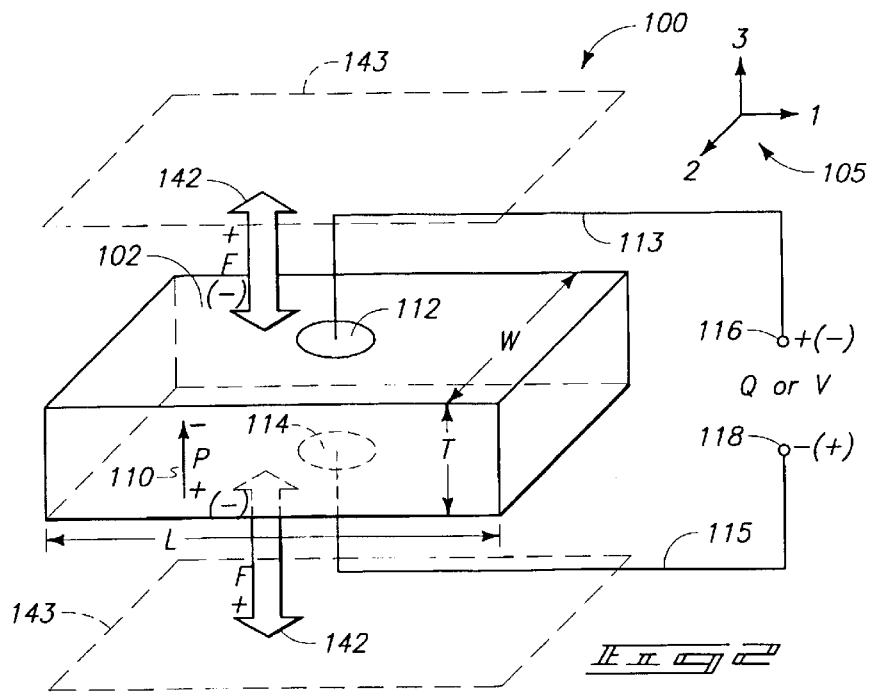

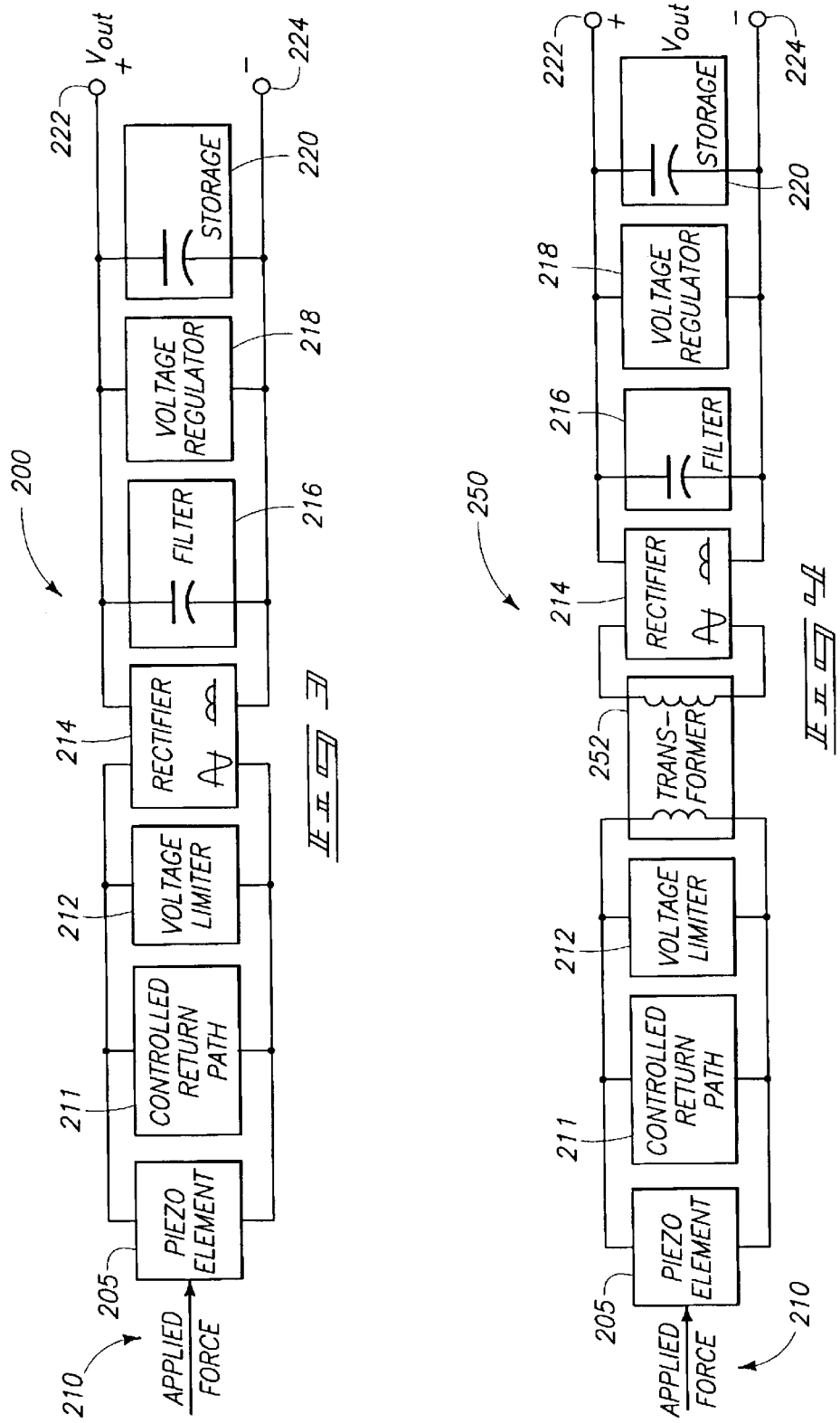

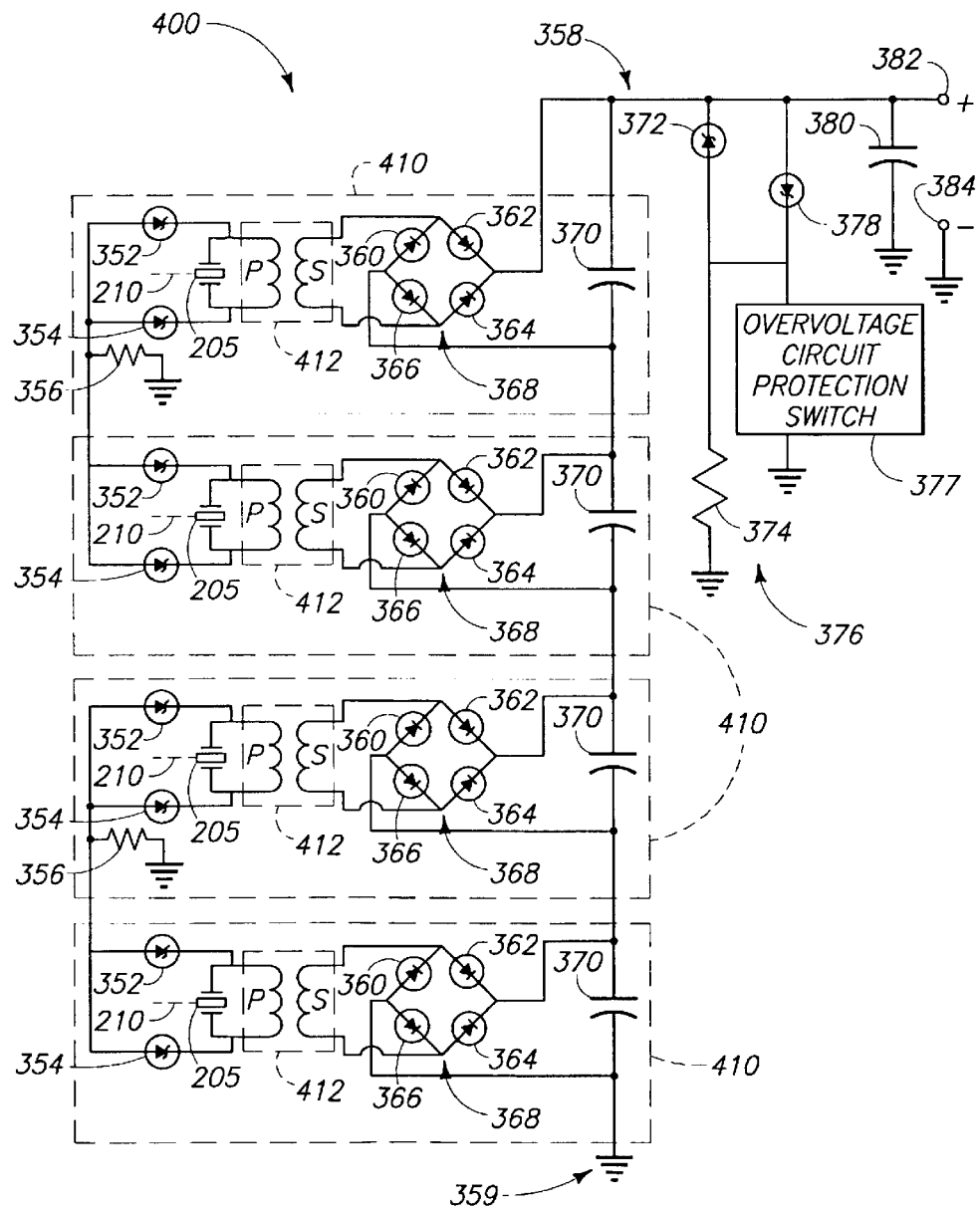

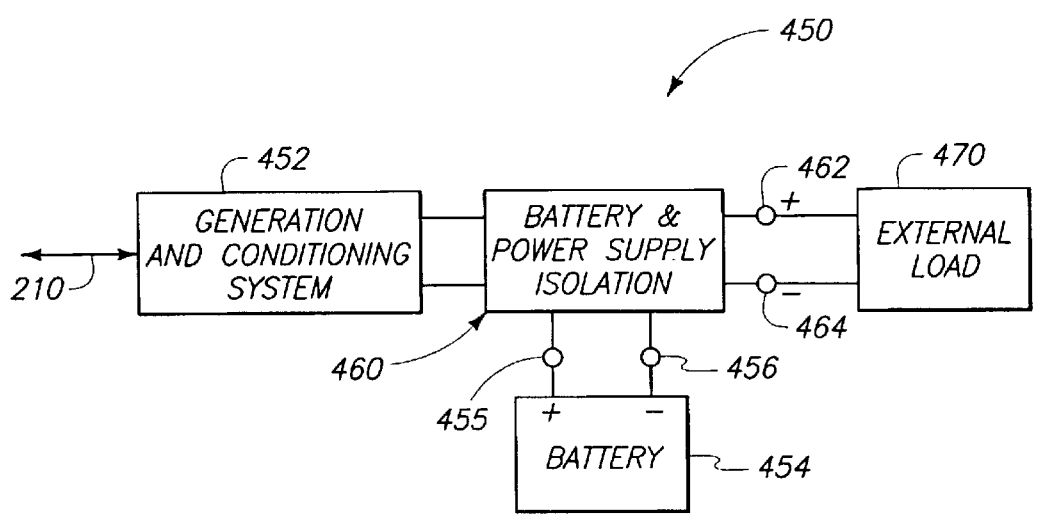

US 6,737,789 B2

FORCE ACTIVATED, PIEZOELECTRIC, ELECTRICITY GENERATION, STORAGE, CONDITIONING AND SUPPLY APPARATUS AND METHODS

CROSS REFERENCE TO RELATED CASES & MATERIALS

This application is a utility patent application claiming priority upon U.S. provisional patent applications Ser. No. 60/350,396, filed on Jan. 18, 2002, and Ser. No. 60/350,428, filed on Jan. 18, 2002, both incorporated by reference hereinto in their entirety.

TECHNICAL FIELD

The invention relates to small scale, force activated, electricity generation, storage and supply apparatus. More specifically, the invention relates to systems for converting mechanical force into electrical energy in a form which can be efficiently utilized for powering small scale electrical apparatuses.

BACKGROUND OF THE INVENTION

The term piezoelectric refers to a class of materials which exhibit the generation of an electrical charge when subjected to an applied force that produces stress or otherwise induces strain in the piezoelectric material.

One common type of piezoelectric device is a pressure transducer. Such piezoelectric pressure transducers typically are exposed to a fluid medium which exerts pressure directly or indirectly upon a diaphragm. The diaphragm is mechanically coupled to a piezoelectric element in a manner that applies a force thereto. The applied force generates a stress and related strain in the piezoelectric material. The piezoelectric element or elements respond to the applied force and strain by generating an electrical charge. The electrical charge is directed to poles of the piezoelectric element which have electrical leads connected thereto. Electrical circuitry detects this generated electric charge and derives an electric signal representative of the pressure within the fluid medium.

One attribute of piezoelectric sensors and other similar piezoelectric devices is that the amount of electrical charge is typically very low. This small amount of electrical charge can be easily adapted to in the context of sensors because the flow of charge can be highly impeded using the sensor detection circuitry. The high impedance allows a small charge to produce a detectable voltage and provide a high degree of sensitivity.

Even though piezoelectric sensors have been very successful, there has remained a substantial problem in generating a useful and efficient amount of electrical charge from piezoelectric generators for use as sources of electrical power. This limitation has severely restricted the potential applications for such devices, particularly when the devices are passive relative to any other source of electricity. In prior devices, the small amount of charge has effectively been lost in the generator and associated circuitry thus severely restricting the utility to applications having extremely low power requirements.

There remains a need in this technical art for piezoelectric power supplies which can efficiently generate useful amounts of electricity for operating small scale electrical devices. In particular, there is a need for completely passive or, otherwise unpowered devices that can be used to generate electricity for relatively small scale electrical devices. Such small scale piezoelectric generators may be particularly desirable where carried upon a person or small object or device needing only a small electrical consumption.

These and other objectives and considerations have been fully or partially addressed by the current invention, which is described in detail below. Some of the benefits and advantages of the current invention will be given in this description. Others will be apparent from the nature of the invention when considered in conjunction with the description given herein. Although effort is made to fully describe the invention and it's various benefits, advantages and principals of operation; some of such information may not be evident or available at this time. In the future such may become evident or available after additional experience is gained using the invention. The best modes of the invention and various features and advantages now known are described herein.

BRIEF DESCRIPTION OF THE DRAWINGS

Preferred embodiments of the invention are described below with reference to the following accompanying drawings which are briefly described below.

FIG. 1 is a diagrammatic perspective view illustrating an element of piezoelectric material according to one aspect of the invention.

FIG. 2 is a diagrammatic perspective view illustrating an element of piezoelectric material according to another aspect of the invention.

FIG. 3 is a block diagram of a piezoelectricity generator in accordance with one embodiment of the invention.

FIG. 4 is a block diagram of a piezoelectricity generator in accordance with another embodiment of the invention.

FIG. 7 is an electrical circuit schematic in accordance with another embodiment of the invention.

FIG. 8 is a diagram showing certain aspects of a further embodiment in accordance with the invention.

DETAILED DESCRIPTION OF THE PREFERRED EMBODIMENTS

Figure 5:
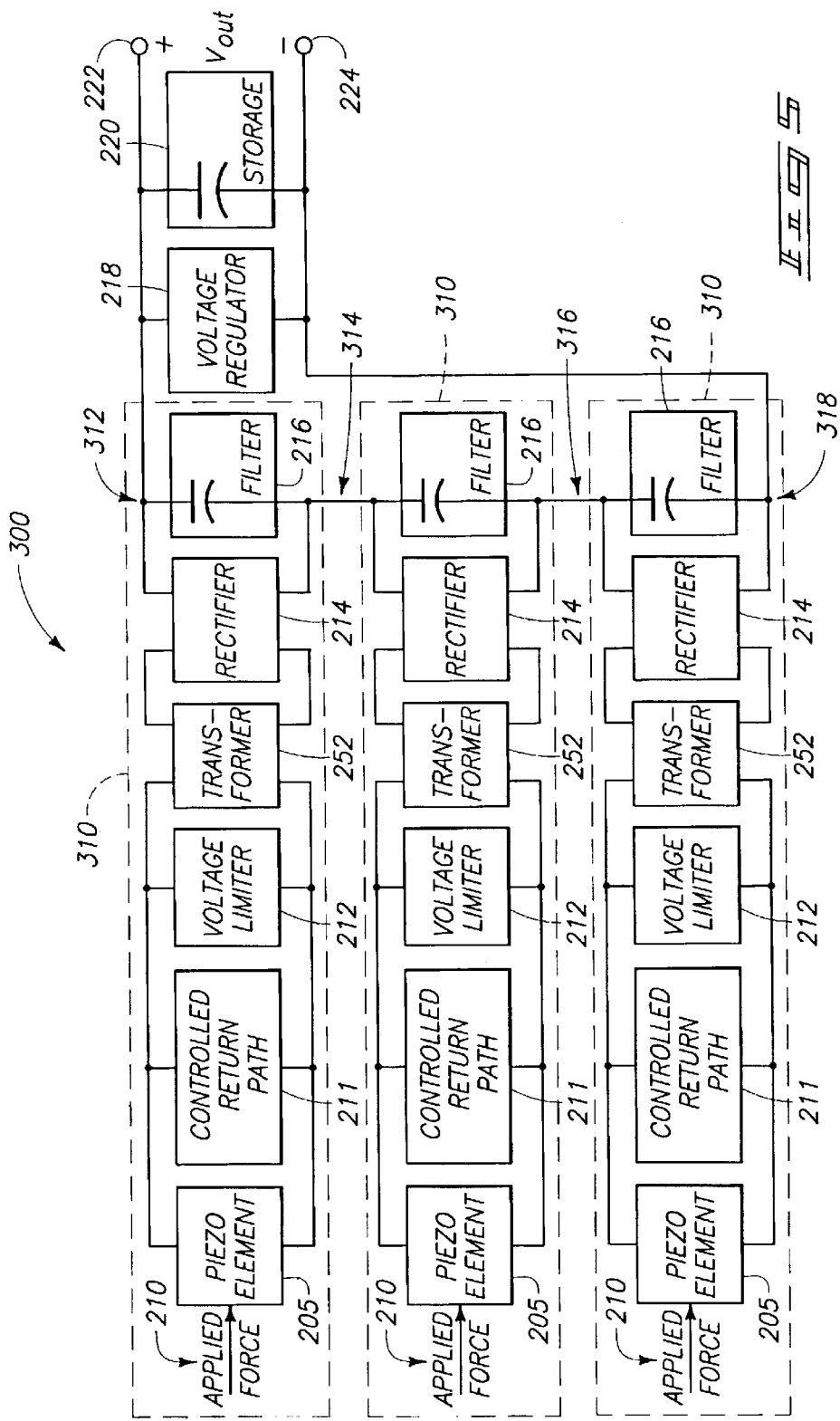
FIG. 5 is a block diagram of a piezoelectricity generator in accordance with a further embodiment of the invention.

One premise of this description is helpful to understand before considering the different embodiments described herein. Each embodiment may be described using terminology which varies between different embodiments. However, the writing of this document was premised upon the ability of the writer to utilize terms which may be used in connection with one embodiment to also apply to other embodiments for the same or similar structures, functions, features and aspects of the concepts and technology being described. Accordingly, unless indicated otherwise herein, terms from all embodiments are included in this description and are applicable for describing and defining the technology and exclusive rights being sought. Terminology used in the claims as originally filed is also descriptive of the inventions described herein and forms part of the disclosure of this invention.

FIG. 1 illustrates a piezoelectric arrangement 100. Included in arrangement 100 is piezoelectric material element or elements 102. The piezoelectric element 102 as shown has a length L, a width W, and a thickness T. The piezoelectric element 102 has an electrical polarization as indicated by polarization vector 110. The piezo element 102 may be in the form of a thin film. Such thin films may advantageous be made largely of single crystals, or more preferably can be a thin film made principally or totally of a single crystal. The piezo element may alternatively be an array of macroscopic pieces which are electrically and mechanically coupled. Still further, the piezo elements may be formed using a template or templates that provide unitary or complementary crystals that can be electrically and mechanically coupled.

The piezoelectric elements in their various forms and configurations are designed to operate near resonance, e.g. at or near the resonant frequency associated with the crystal or element being used. Resonance may vary as a function of a number of properties of the piezo material or materials being employed. These may include the size, shape, density and other physical parameters of a particular configuration for the element or elements used. These factors affecting resonance may also include the constituent makeup, for example, the basic crystal constituents and the various dopants or additives used to provide and vary the piezoelectric properties of the crystal or crystals being employed.

Further included in arrangement 100 are piezoelectric element electrical contacts 112 and 114. These electrical contacts or coupling elements are electrically coupled to suitable electrical leads 113 and 115. The electrical contacts 112 and 114 and leads 113 and 115 are respectively connected to electrical nodes 116 and 118. Such electrical nodes generally indicate other connections or electrical components which are electrically coupled to the piezoelectric element 102.

Also illustrated in FIG. 1 is an axis indicator 105 illustrating the three mutually orthogonal reference axes 1, 2 and 3. This axis labeling is as conventionally used in the piezoelectric arts. It is conventional in such art that the axis 3 direction be designated parallel to the direction of polarization of the element, such as axis 3 in the polarization direction 110 of element 102.

As illustrated in FIG. 1, a force 120 is applicable to the piezoelectric element 102 parallel to the axis 1 direction. When the force 120 is applied to element 102, an electrical charge is developed and a resultant voltage differential is also developed within element 102. Such force induced voltage differential is manifested in the direction parallel to axis 3. Such induced voltage is also along the polarization axis 110. The electric charge can be removed using contacts 112 and 114, which are electrically coupled to nodes 116 and 118 which represent a conductive electrical circuit that receives and conducts the current resulting from the generated and released charge.

The polarity of the generated charge depends upon whether the element 102 is under compression or tension as a result of applied force 120. If the element 102 is subjected to an applied compressive force 120 (indicated as (+) force), then the resulting electrical polarity is positive at node 116 and negative at node 118. Conversely, if the element 102 is under tension (indicated by negative (−) force) due to an applied tensile force 120, then the electrical polarity of the resulting electric charge is negative at node 116 and positive at node 118. These exemplary applied force and resulting polarity associations are illustrated as plus (+) and minus (−) signs adjacent to force arrows 120 and electrical nodes 116 and 118. One polarity is indicated without parentheses and the other with parentheses.

FIG. 2 illustrates another piezoelectric arrangement 140 using piezoelectric element 102. Within arrangement 140, a force 142 is applied to element 102 in a direction parallel to axis 3 of indicator 105. As shown, force 142 may be applied such that the element 102 is under compression or tension along the polarization axis 3.

When element 102 is under tension due to applied force 142, the polarity of the resulting electrical charge is positive (+) at node 116 and negative (−) at node 118. Alternately, if the applied force 142 places the element 102 under compression, then the polarity of the resulting electrical charge is negative (−) at node 116 and positive (+) at node 118.

It is understood that alternative force application and resultant electrical charge scenarios (not shown) are also possible. For example, the piezoelectric element 102 can be subjected to a shearing force or bending moment, each leading to strain and the corresponding generation of an electrical charge and associated voltage differential across properly selected pole positions.

It should further be understood that the electrical contacts 112 and 114 typically will be in substantially continuous electrical contact with the entire area of the poled faces of the element 102 to which they are respectively applied. Alternatively, it may be desirable for various reasons to have less than full electrical contact in particular configurations.

FIGS. 1 and 2 diagrammatically show mechanical force application structures 121 and 143 which respectively are used to apply the indicated forces to element 102. Various force application mechanisms or structures 121 and 143 can be used and are shown in expanded relationship and in phantom line for respectively applying forces 120 and 142. The particular mechanical force application structure may be a layer or plate of suitable material or materials. In some embodiments, the force application structures preferably are configured to apply an even contact pressure which may be compressive or tensile over the entire area of the force application faces of the element 102 to which they are applied. Noncontinuous and uneven configurations for application of force to the piezoelectric element may also be desirable in particular instances. Another configuration for the mechanical force applicators may cause an applied shear force or bending moment to be developed. Other configurations of piezoelectric elements, applied forces, and electrical contacts are also possible.

The mechanical, electrical, physical and other properties of a particular piezoelectric material determine the amount of electrical charge that is generated in response to a given applied force. This and the impedance of the attached circuitry will affect the voltages developed at the contacts, leads and nodes. Some of these properties are represented in the art by parameters which are identified by letters indicating variable property quantities. The following such properties and their representative parameters and shorthand identification letters are indicated below.

d: Is the ratio of the generated electrical charge density (short circuit) to the applied mechanical stress. Units are coulombs per square meter over newtons per square meter.

g: Is the ratio of the generated electrical field voltage (open circuit) to the applied mechanical stress. Units are volts per meter over newtons per square meter.

k: Is the square root of the ratio of stored electrical energy to the applied mechanical energy. Units for both energy types are in joules; therefore k is dimensionless. The symbol k is also referred to as the coupling coefficient. Generated energy is stored in the piezoelectric material until conducted away by corresponding contacts and external circuitry, subject to decay and dissipation.

Other properties of piezoelectric materials known or hereafter developed may be useful in or pertinent to the technology described herein.

The letters representing the physical properties described above are generally used in combination with subscript numbers indicating the axes 1, 2 and 3. The subscript axes numbers reflect the orientation of the generated electric charge and/or voltage field vector relative to the applied force. These numbers are also consistent with the labeling of the axes as provided by indicator 105. The following letter/number combinations are generally used herein:

$d_{31}$: Is the generated electrical charge density in the axis 3 direction when force, compressive or tensile, is applied in the axis 1 directional orientations.

$d_{33}$: Is the generated electrical charge density in the axis 3 direction when force, compressive or tensile, is applied in the axis 3 directional orientations.

$g_{31}$: Is the generated electrical field in the axis 3 direction when compressive or tensile force is applied in the axis 1 directional orientations.

$g_{33}$: Is the generated electrical field in the axis 3 direction when compressive or tensile force is applied in the axis 3 directional orientations.

$k_{31}$: Is the stored generated electrical energy in the axis 3 direction when force, compressive or tensile, is applied in the axis 1 directional orientations.

$k_{33}$: Is the stored generated electrical energy in the axis 3 direction when force, compressive or tensile, is applied in the axis 3 directional orientations.

$k_t$: Is the stored generated electrical energy in the axis 3 direction when the force, compressive or tensile, is applied uniformly in all directions. In some usages $k_t$ is referred to by the alternative nomenclature $k_p$.

The particular values of the respective physical properties recited above help define or otherwise indicate the overall efficacy or efficiency of a piezoelectric material and element made therefrom.

In the embodiments shown and described herein, the preferred piezoelectric material is lead-magnesium-niobate lead titanate, hereafter referred to for brevity by the acronym PMN-PT. The preferred PMN-PT piezoelectric materials used herein, include compounds belonging to the following family of compounds defined as follows:

i) $(1-x)Pb(A_{1/3}Nb_{2/3})O_3-xPT$; or ii) $0.5[(1-x)PbYb_{1/2}Nb_{1/2}O_3-xPT]-0.5PbZrO_3$; or iii) $Pb(Yb_{1/3}Nb_{1/2})O_3-PT$;

Wherein:

iv) A may be optionally selected from $Zn^{2+}$ or $Mg^{2+}$; and v) x is a number between 0 and 1.

The PMN-PT materials used in the preferred embodiments exhibit approximately the following performance characteristics, using the parameters as defined hereinabove:

a) $k_{31}$ is equal to about 0.51 (dimensionless)

b) $k_{33}$ is equal to about 0.91 (dimensionless)

c) $k_t$ is equal to about 0.62 (dimensionless)

d) $d_{31}$ is equal to about 9000 ($10^{-12}$ coulombs per newton) or greater e) $d_{33}$ is equal to about 2000 ($10^{-12}$ coulombs per newton) or greater Using a piezoelectric element, or an array of such elements, or a thin film of single crystals bonded to a suitable substrate, or a thin film template, comprised of the PMN-PT material described above results in the generation of electrical charge in readily applicable quantities.

An example of the electrical output from a suitable hypothetical construction according to the invention will now be described. The PMN-PT material in this example includes 10 sheets of thin film multiple crystal with each film being approximately 2.2 mm thick and having planar areas preferably from 15 to 130 cm$^2$. The thin films are mechanically arranged in superposition so as to receive the same applied mechanical force. The electrical connection of each piezo element film is connected in a series-aiding circuit configuration, such as described elsewhere herein. The following calculations indicate the approximate magnitude of the physical and electrical parameters at which such a construction would operate.

Applied force F: 800 newtons (N) (approximately a human footstep).

Frequency of force application: 1 force application per second.

Subsequent calculations are for 1 step.

Total generated electrical charge per layer:

$$Q = d_{31} * F = 8000 \text{ pico-coulombs/newton} * 800 \text{ newtons} = 6.4 \text{ microcoulombs } (\mu C).$$

(This assumes a conservative 8000 pC/N for $d_{31}$)

Charge from 10 layers=6.4 mC * 10=64 $\mu$C

Generated energy per step $E=\frac{1}{2}Q^2/C$ (where C is the capacitance=100 nanofarads)

$$E = \frac{1}{2} * (64 \mu C)^2 / 100 nF = 20 \text{ millijoules per step}$$

This corresponds to a power rate of 20 milliwatts which is a useful level of electrical power in many small scale electrical devices.

A unit having a cross-sectional area of about 15 cm$^2$ and which is selected to exhibit the above approximate parameters would produce sufficient energy under the force of human footsteps alone to power a number of useful circuits such as, for example, a radio, cellular phone and other devices.

The application of a single force instance to a piezoelectric element generates a limited amount of electrical charge. In some applications, this may be sufficient. In other applications, the current or charge requirements may require repetitive stress and relieve cycles to a piezoelectric element in order to generate a corresponding sequence containing a plurality of electrical charges and thus generate a suitable amount of electricity. This may be accomplished, for example, through the application of a smoothly oscillating force, or through a sequence of applied forces. Such sequence of applied forces may be regular or irregular depending on the application and particular circuitry used. Such forces may also be applied as force impulses. Other force application scenarios are also possible. Devices made according to this invention may need repeated force application cycles to generate usable electricity.

The invention is intended to beneficially exploit a variety of force application mechanisms or other force application sources. Due to the greater efficiency provided by the inventive concepts taught herein, some heretofore unusable force applications can now be utilized to generate small quantities of electricity. Possible sources of applied force may include, but are not limited to, the following: human or animal footsteps; wave action in, on or adjacent to a volume of air or a body of water or other desirable fluids; windmills; water wheels or turbines; geothermal steam flow; gas or liquid flow; vehicle motion over a surface; fall arresters; braking systems; exercise or sports equipment; etc. In essence, the invention is directed to generating small but usable quantities of electrical energy from various mechanical energy sources having correspondingly sufficient abilities to apply force either directly or indirectly to the piezoelectric element.

The electrical charge generation behavior of the preferred PMN-PT materials used in the preferred embodiments is advantageously combined with preferred electrical circuitry so that effective electrical power generation can be realized. Preferred circuitry according to the present invention are described below. The circuitry is advantageously completely passive and thus requires no battery or other stimulating or initiating power source to allow operation.

FIG. 3 diagrammatically illustrates a preferred electricity generation and conditioning system 200 according to one embodiment of the invention. The system 200 includes a PMN-PT piezoelectric element 205, being subjected to applied force 210. The applied force 210 may be a single, multiple, cyclical or other repetitive force as needed in a particular application.

The electrical contacts (not shown in FIG. 3; but analogous to contacts 112 and 114 of FIGS. 1 and 2) of piezoelectric PMN-PT element 205 are electrically coupled to voltage limiter 212. Voltage limiter 212 serves to prevent damage to the PMN-PT element 205 or other circuitry which may result from excessive generated voltage. An excessive voltage may be due to an applied force 210 of excessive magnitude or other causes. Voltage limiter 212 may comprise back-to-back zener diodes. Other voltage limiters may also be used if suitable for this invention.

The components forming voltage limiter 212 either alone or together with additional components may also advantageously perform another function of acting as a charge return channel through which electrical charge may flow to the piezoelectric unit 205 to prevent depolarization of the piezoelectric element. Prior piezoelectric technology has previously demonstrated debilitating depolarization due to repetitive cycling of piezo materials.

The charge return channel of the preferred circuitry of this invention operates differently depending on the polarity of the output produced by the piezoelectric element or elements 205. In the construction shown, the polarity can in general be either positive or negative and thus the charge return channel is provided to operate in either polarity mode. This bidirectional charge return channel can be provided by several suitable means, such as the zener diodes 352 and 354 shown in the more specific circuitry of FIG. 6. Other means for producing or channeling return charge back across the poles of the piezoelectric units may alternatively be possible consistent with this invention.

The voltage limited electrical charge from PMN-PT element 205 of system 200 is further electrically coupled to a rectifier 214. Rectifier 214 may comprise a full-wave bridge rectifier. Other rectifier types may also be used depending on the specifics of the rectifiers and circuit in which it is used. Rectifier 214 receives the pulsing or alternating (in the case of an oscillating force 210) electrical current from PMN-PT element 205 and limiter 212 and produces a corresponding pulsating direct current (D.C.) output.

The pulsating direct current output from rectifier 214 is preferably electrically coupled to a filter 216. Filter 216 may comprise a capacitor which effectively serves as a ripple filter. Other filter constructs may alternatively be acceptable for use in systems made in accordance with the invention.

Filtered electrical current from filter 216 is preferably electrically coupled to a voltage regulator 218. Regulator 218 may comprise a shunt-type voltage regulator. Other regulator types may alternatively be suitable for use in constructions according to this invention. Voltage regulator 218 operates to receive the filtered direct current from filter 216 and to provide an output electrical charge and associated current having a regulated voltage, which is preferably a regulated voltage having an approximately constant voltage.

The regulated voltage output from regulator 218 of system 200 is advantageously electrically coupled to a storage element 220. Storage element 220 may comprise a capacitor or other suitable electrical charge storage devices now known or hereafter developed which are consistent herewith. Electricity storage element 220 receives and stores the regulated electrical output from regulator 218. Such output is smoothed in voltage and preferably has a nearly constant voltage in at least some forms of the invention.

The electrical charge stored in the storage element or elements 220 are electrically coupled to output nodes 222 and 224. The system 200 is configured such that the stored electrical charge polarity is preferably positive (+) at node 222 and negative (−) at node 224. External circuitry (not shown) may be connected to system 200 at nodes 222 and 224 to utilize the generated, conditioned (for example filtered and regulated) and stored electric charge contained therein. Thus nodes 222 and 224 can serve as outputs to the piezo-electricity generator system described.

FIG. 4 illustrates an energy generation and conditioning system 250 according to another preferred embodiment of the invention. System 250 includes all of the elements 205, 210, 212, 214, 216, 218, 220, 222 and 224, respectively functioning substantially as described for system 200. That description also applies to system 250 in the same or substantially the same manner.

The embodiment of FIG. 4 also is noteworthy in that it utilizes a multi-unit piezoelectric array formed by the plurality of elements 205. The array can be produced by having a multiple element array in stacked relationship wherein the applied force is transmitted by passing through a plurality of such elements 205. More preferably, the stacked array arrangement passes the applied force through all layers forming piezoelectric elements in the array thus causing the voltage rise to simultaneously or nearly simultaneously be developed in all of the piezoelectric elements. This is believed advantageous for efficient generation of electrical power. Other configurations may be operable and desirable.

FIG. 4 shows that system 250 preferably further includes a transformer 252. Transformer 252 is advantageously a step-up transformer to increase the voltage as compared to the output voltage from the piezo element directly or the resultant output of the piezo element as affected by action of voltage limiter 212. Other types of transformers may also be useful in systems constructed in accordance with the invention.

In some forms of the invention it may be desirable to use a piezoelectric transformer as transformer 252. Piezoelectric transformers are previously known in the art and utilize a piezoelectric element or elements having several poles that have pole pairs that are along differing axes or otherwise positioned differently upon the piezoelectric transformer core. The transformers use an applied electrical input voltage along one pole pair to induce a stress and strain in the piezo element which creates a secondary charge of higher voltage output from a secondary pole pair different from the first pole pair. Such piezoelectric transformers are described in an article entitled "Extensional Vibration of a Nonuniform Piezoceramic Rod and High Voltage Generation" by J. S. Yang and X. Zhang, International Journal of Applied Electromagnetics and Mechanics, a copy of which is attached as Appendix C. That article and the articles referred to at the endnotes are incorporated by reference hereinto as illustrating appropriate piezoelectric transformers which may be used in the invention.

In some forms of the invention it may be possible to have the piezoelectric elements mounted adjacent to the piezoelectric transformers to minimize conducting leads and ensure compactness. Other configurations are possible.

Transformer 252 operates to alter (i.e., elevate or reduce) the voltage of the electrical charge flow generated at PMN-PT element 205 in response to applied force 210. Electrical losses inherent to some component types, such as switching diodes, are believed to be reduced or rendered negligible by elevating the voltage generated by piezoelectric PMN-PT element 205. Other benefits of elevating or reducing the generated voltage from piezoelectric PMN-PT element 205 may also be realized with further development of these novel constructions.

FIG. 5 illustrates a cascaded energy generation and conditioning system 300 according to another embodiment of the invention. As shown, system 300 includes three energy generation and conditioning subsystems 310. These subsystems are used in concert, such as in the configuration shown in FIG. 5. Each subsystem 310 includes elements 205, 210, 212, 214, 216 and 242 respectively functioning as described for the system 250. Furthermore, system 300 includes elements 218 and 220, also functioning as previously described.

The three subsystems 310 are electrically coupled at nodes 314 and 316, so as to form a voltage additive series circuit arrangement having positive output node 312 and negative output node 318. Therefore, the individual electrical charges generated and conditioned by each of the subsystems 310 is additively and electrically coupled to output voltage regulator 218. In this way, the electrical sum of the individual electrical charge contributions of the three subsystems 310 may be utilized to provide a greater voltage for use in an associated device being powered by current from output nodes 222 and 224.

The summed electrical charge is input to the regulator 218 by way of nodes 312 and 318. As before, the output voltage regulator 218 provides an output electrical charge flow which is regulated or otherwise conditioned, and which is advantageously of substantially constant voltage. This output is stored in one or more electrical storage elements or stores 220. Finally, the generated, regulated, conditioned and stored electrical charge of the system 300 is available for use by external circuitry (not shown) at output nodes 222 and 224.

Figure 6:
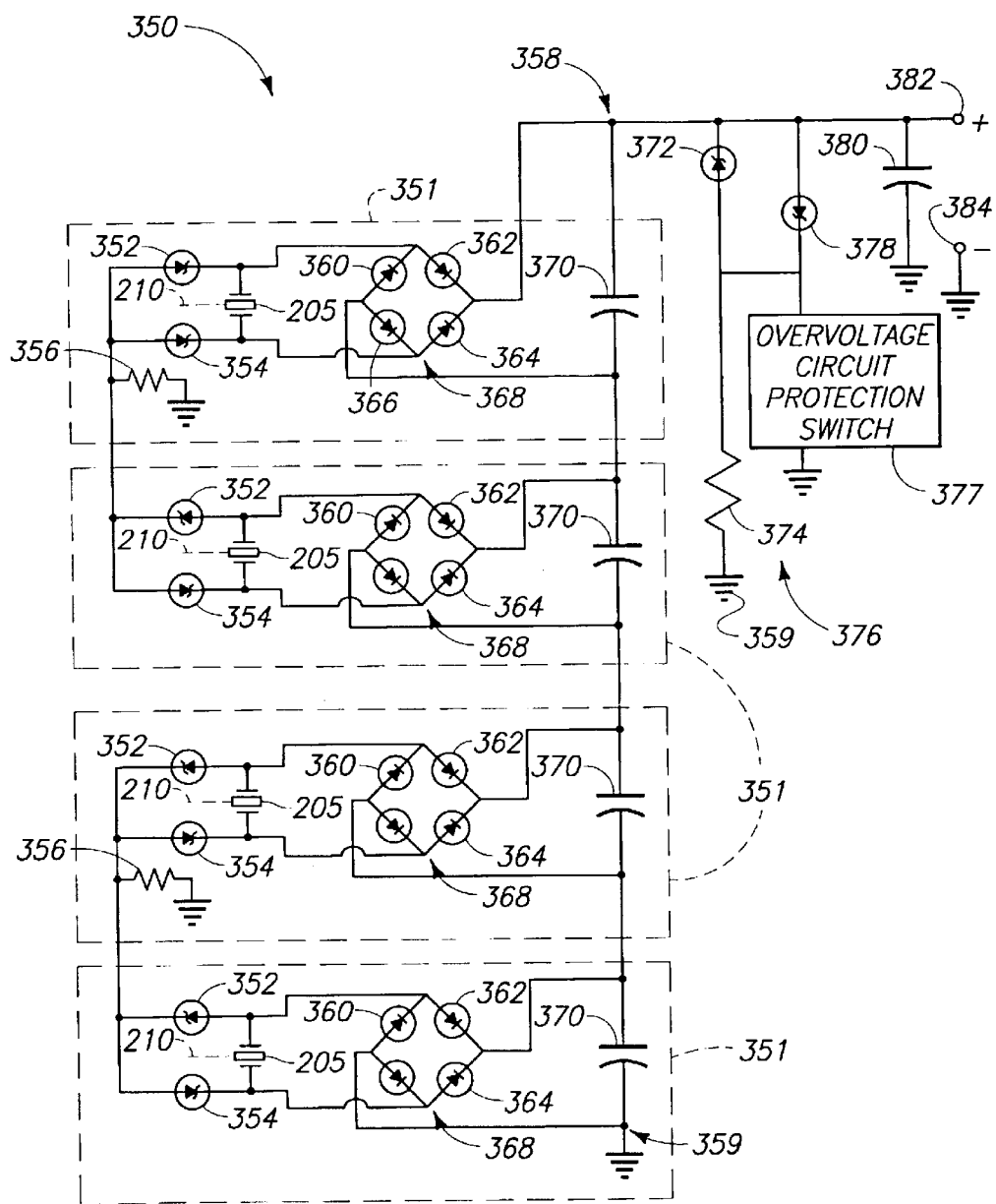
FIG. 6 is an electrical circuit schematic in accordance with one embodiment of the invention.

FIG. 6 is an electrical circuit schematic of an energy generation and conditioning system 350 according to another preferred embodiment of the invention. System 350 includes four like generation and conditioning subsystems 351. Subsystems 351 each preferably include a piezoelectric PMN-PT element 205, being subjected to applied force 210. The PMN-PT element 205 within subsystem 351 generates an electrical charge responsive to the influence of force 210 as described elsewhere herein.

A preferred subsystem 351 also includes a pair of like zener diodes 352 and 354 electrically coupled to PMN-PT element 205 and configured to form a voltage limiter. Voltage in excess of the rated zener voltage of one of the diodes 352 and 354 causes a shunting of excess electrical charge through the voltage limiter advantageously formed by zener diodes 352 and 354. This performs by limiting the voltage of the charge generated by PMN-PT element 205 as it is applied to downstream circuitry, such as to the rectifier or other conditioning circuitry. The conditioning circuitry is preferably of relatively low impedance to more efficiently capture the generated charge.

The preferred construction shown for subsystem 351 further includes one or more impeded ground paths, such as using a shunting resistor 356 which is connected between a suitable ground and the junction between zener diodes 352 and 354. Resistor 356 provides a relatively high-impedance path between the limiting zener diodes 352 and 354 to ground. This serves by providing a limiting effect on the output voltage across the piezo element 205. This also serves to shunt the excess or overvoltage output from the element 205 to ground for dissipation to prevent damage to the generation and conditioning circuitry described herein. Resistor 356 still further serves to impede the return charge drain current rate when one or both diodes are operational. This is significant in preventing too much loss of current while allowing channeling of a return charge or reverse drain current back across between the poles of piezo elements 205 to help prevent depolarization from repeated stress applications.

The preferred subsystem 351 also includes a rectifier sub-circuit 368. Rectifier 368 is advantageously in the form of like rectifier diodes 360, 362, 364 and 366 connected in a rectification bridge as shown in FIG. 6. These rectifier diodes are coupled to the electrical contacts of PMN-PT element 205 at the nodes between diodes 360 and 362, and between diodes 364 and 366, respectively. The diodes 360, 362, 364 and 366 are preferably configured to form a full-wave bridge rectifier. Rectifier 368 is electrically coupled to the PMN-PT element 205 and provides a pulsing electrical D.C. output responsive to the pulsing or alternating electrical charge input from the PMN-PT element 205.

Subsystems 351 further preferably include a filter capacitor 370. Filter capacitor 370 is electrically coupled to the output nodes of rectifier 368. The output nodes are formed at the nodal connections between diodes 362 and 364, and between diodes 360 and 366. This output provides voltage conditioning, which serves to filter ripples commonly demonstrated by the pulsating direct current output from rectifier 368. The resulting smoothed or regulated electrical current develops a voltage across capacitor 370 and stores charge therein in at least some operational modes.

In the embodiment of FIG. 6, the four like subsystems 351 are electrically coupled in series circuit configuration such that the electrical charges across the four respective filter capacitors 370 are voltage additive and electrically coupled to positive (+) node 358 and negative (i.e., (−), ground) node 359. In this way, the cumulative electrical charge generated and conditioned by the four like subsystems 351 is available for utilization by an external load (not shown). This construction and preferred operations thereof provide systems which have improved voltage output and efficient charge storage capability for the amount of mechanical work input.

FIG. 6 further shows that the preferred system 350 also advantageously includes zener diode 372, zener diode 378, and resistor 374. Zener diode 372 and resistor 374 are configured to form a voltage regulator 376, electrically coupled in series between node 358 and ground node 359. The regulator 376 operates by shunting electrical charge having a voltage above a pre-determined regulation voltage level. Voltage regulator 376 preferably helps to realize a regulated voltage and beneficially an approximately constant voltage between nodes 358 and 359.

Zener diode 378 serves to provide reverse voltage protection. It performs such protection by shunting reverse voltage electrical current to ground. Reverse polarity voltage across nodes 358 and 359 may incidentally develop or appear for a number of reasons, such as by connection of the circuit to an energized load or failure of a component within system 350. An appropriate overvoltage protection sub-circuit 377 is included between ground and the node shared by zener diode 378 and resistor 374. This can also be referred to as an overvoltage crowbar and is used to dissipate excessive voltage developed at such node.

System 350 further advantageously includes a storage capacitor 380 electrically coupled across nodes 358 and 359. Capacitor 380 may, for example, have an electrical capacity of 200 microfarads or other suitable values dependent upon the specifics of the circuit. Capacitor 380 operates to store the electrical charge generated and condition by other portions of system 350.

System 350 also includes electrical output nodes 382 and 384. In the preferred construction shown in FIG. 6, node 382 is normally of positive (+) polarity and is electrically coupled to the positive node of capacitor 380. Node 384 is of negative (−) polarity and is advantageously directly coupled to ground node 359. An external circuit or load (not shown) may be coupled to the system 350 at output nodes 382 and 384, so as to utilize the electrical charge generated, conditioned and stored therein.

FIG. 7. is an electrical circuit schematic of a piezoelectric energy generation and conditioning system 400 according to another embodiment of the invention. The system 400 includes four like generation and conditioning subsystems 410. Each subsystem 410 includes elements 205, 210, 352, 354, 356, 368 and 370, respectively functioning substantially as described above for system 350.

Subsystems 410 further include transformers 412. Transformer 412 has a primary side P and a secondary side S. The primary side P of transformer 412 is electrically coupled to opposing poles of the piezoelectric PMN-PT element 205. Transformer 412 receives electrical charge generated by PMN-PT element 205 by way of primary side P and produces a corresponding electrical charge at the secondary side S. The transformers may be piezoelectric transformers as explained above.

Transformers 412 are preferably step-up transformers, so that the electrical charge derived at side S is of elevated voltage with respect to the electrical charge generated by the PMN-PT element 205 and coupled to side P. By elevating the voltage at side S relative to side P, transformer 412 helps to compensate for the switching voltage (i.e., forward bias) losses of the diodes 360–66 within rectifier 368. Other benefits of transformer 412 may also be realized.

The four subsystems 410 of system 400 are electrically coupled so as to provide a summation of respective electrical charge between positive (+) node 358 and negative (−) node 359. Further included in system 400 are elements 372, 374, 376, 377, 378 and 380, respectively functioning substantially as described for system 350.

System 400 includes electrical output node 382, typically having positive (+) polarity, and electrical output node 384, typically having negative (−) polarity. An external load (not shown) may be connected to nodes 382 and 384 such that the electrical charge generated, elevated, conditioned and stored within system 400 is constructively utilized.

The constructions shown and described with regard to FIGS. 5, 6 and 7 show plural piezo elements 205. These piezo elements can advantageously be configured to experience the same activating force by layering the piezo elements into an array wherein the activating force passes through one, some or all of the piezo elements simultaneously. Alternatively, some configurations may use multiple piezo elements which may not be configured to simultaneously experience the same or substantially the same activating force or forces.

As discussed above, an external load powered by the generators and associated circuitry may comprise, for example, a cellular telephone. Other external loads are also possible, such as, for example: radio receiving and/or transmission equipment; lighting equipment; global positioning system (GPS) receivers; audio equipment; still and/or video camera equipment; computers; measurement and control instrumentation; sports equipment and sports devices; and other possible uses. A variety of one or more external loads are potentially powered.

FIG. 8 illustrates another possible embodiment of the invention, shown generally as system 450. System 450 includes an energy generation and conditioning system 452. The energy system 452 may comprise any of the generation and conditioning systems 200, 250, 300, 350 or 400 described above and others consistent with the invention. The energy system 452 is subjected to an input force 210, in a manner, for example, as described above.

System 450 also is adapted to allow connection of a battery 454. Battery 454 can be electrically coupled to positive (+) terminal 455 and negative (−) terminal 456. Battery is preferably subject to convenient connection and disconnect at terminals 455 and 456 using a variety of suitable connectors.

The preferred system 450 may also advantageously include a battery and power supply isolation and control sub-circuit 460. Isolation and control circuit 460 may be constructed using a variety of designs, some commercially available and well-known in the art of battery interface circuitry. As shown, the battery connection/disconnection terminals 455 and 456 are connected to isolation circuit 460 to allow complete control over the draw of supplemental power from battery 454 for use by load 470. It can also allow complete control over the supply of charging current from energy supply 452 at a voltage suitable for charging battery 454. Depending on the nature of the electricity demanded by load 470, charging current may be supplied either when there is no load, when there is a load, or in some intermittent process. The isolation circuit 460 also has terminals 462 and 464 which can be a variety of connection and disconnection terminals for load 470. It can also represent a hard wired connection not subject to convenient disconnection.

System 450 can operate by charging battery 454 during periods of excess available output current from circuitry 452. System 450 can alternatively operate by receiving supplementary current from battery 454 during periods where the load demand exceeds the output of circuitry 452 alone. This configuration thus provides additional electricity storage capacity and operating flexibility.

Alternatively, the circuitry of system 452 may itself provide any desired isolation circuitry or other interactive operating control relative to utilization of battery 454.

In a first mode of operation of system 450, applied force 210 results in the generation and conditioning of electrical charge by energy system 452. This conditioned electrical charge is stored by battery 454 and/or consumed by external load 456. In this way, energy system 452 and battery 454 cooperate to serve the electrical demand of external load 456. Furthermore, electrical charge generated and conditioned by the system 452 in excess of the electrical demand of external load 456 may be used to replenish the charge stored in the battery 454.

In another mode of operation of the system 450, the external load 456 is isolated from the energy system 452 and the battery 454, so that electrical charge generated by energy system 452 may be used exclusively to replenish the charge stored in the battery 454. Other modes of operation for the system 450 are also possible.

In addition to the novel systems described herein, the invention further includes novel methods. Such novel methods in one form are directed to generating an electrical charge using a piezoelectric material by subjecting such piezoelectric material to a force or other means for applying stress and/or strain thereto.

In preferred forms of the invention the methods advantageously include selecting a suitable piezoelectric material which is more preferably a suitable piezoelectric thin film material. Suitable piezoelectric materials may include those referred to as relaxor materials with enhanced electrical charge development capabilities. Such suitable piezoelectric materials may advantageously be selected from piezoelectric materials having pseudomorphic phase boundary piezoelectric structures contained therein. Such suitable piezoelectric materials are more advantageously selected from the piezoelectric materials falling in the group of solid state solutions or mixtures known as lead-magnesium-niobate lead titanate (PMN-PT) or mixtures similar thereto. More particularly, the preferred piezoelectric materials used in the invention may advantageously be selected from the group of preferred piezoelectric materials indicated more specifically elsewhere in this document.

According to the currently preferred modes of the invention, the preferred piezoelectric PMN-PT materials are more preferably made in forms which are either a single crystal or approximations of single crystals or other configurations which provide similar or improved electrical generation capabilities as single crystals or thin films composed of single or multiple crystals which are arrayed in a crystallographic arrangement which approximates a single crystal in thickness and achieves crystal boundary interfaces which allow for suitable electrical transmission of generated charge from one crystal to another and provide conduction of charge to the electrical poles of the piezoelectric element. The single crystals are preferably of relatively thin dimensions as described hereinabove. The other alternative materials and production techniques indicated above also apply in the selection and production of suitable and preferred materials used as piezoelectric elements in the invention.

Methods according to the invention may also include generating electrical charge by applying force or otherwise producing a stress in the piezoelectrical material. This is advantageously done by compressing, tensioning, bending, shearing, torsionally distorting or otherwise forcing the matrix of the piezo material being used as the charge generating element or assembly. A variety of mechanical structures may be employed for performing such forcing. This will depend in part upon the configuration and desired mode of stressing and/or straining which is desired for a particular device.

The stressing of the piezoelectric generator can advantageously be done by subjecting the piezoelectric material element or elements to a force or other stress and/or strain in a single, multiple, or other impulsive manner, or in a cyclical or other repetitive manner. This can be done at a constant frequency, such as 1 cycle per second, or other frequency found to be desirable.

It has been found significant that improved performance and efficiency can be achieved by applying the force in a manner which tends to match the frequency of the applied force with the resonant frequency of one or more of the piezo element or elements present. Advantageously, the applied force and resulting stress and/or strain result in a frequency of strain in the piezoelectric material which causes the piezo element to achieve or operate at or near its resonant frequency to achieve a state of mechanical resonance and thus more efficiently transform the applied mechanical energy into transformed and generated electrical energy.

The piezoelectric crystals, thin films, crystal arrays, or other indicated piezo element structures described herein are designed to operate near resonance by choice of the dimensions of the elements and with possible effect of any mechanical coupling to supporting substrates, holding structures, or other components of the system having mechanical coupling to or with the piezo element or elements.

The optimization of the systems made in accordance with the invention may be determined based upon the utilization of preexisting force-frequency relationships. This depends on geometrical factors of the piezo element or elements, and possibly related or coupled structures and also depends on the dielectric properties of the piezo element or elements. For example, where the energy is being derived from the footsteps of man or animal, then the periodic or approximately periodic frequency rate of the force applied to the piezoelectric generator units 205 will guide the appropriate selection and design of circuitry and related parts of the system so as to allow better response from the system as it is employed at the typical frequency. Depending on the system parameters, the frequency of force application may not have a highly determinative effect on the energy derived. In other cases the system may demonstrate significant differences depending on the force and how it is applied and utilized by the piezoelectric generator.

The novel methods also preferably include limiting the voltage output from the piezo element or assembly forming the piezo material used in a particular device. The limiting of voltage is preferably done by reducing or eliminating any excessive voltages developed across the piezo unit or units employed. As shown, the voltage limiting function is advantageously performed by the voltage limiters 212. This can be performed in more specificity by the zener diodes 352 and 354 which prevent an excessive voltage of either polarity across piezo element 205. The excess voltage is shunted to ground via resistor 354.

The novel methods further include providing a suitable return path for electrical charge to be conducted to the piezo element 205 to prevent depolarization from occurring after repeated cycles of piezoelectric charge generation. This return path is also provided by the zener diodes 352 and 354 depending upon the polarity of charge being generated across the piezoelectric unit 205.

Methods according to the invention further preferably include transforming the output voltage from the piezoelectric units 205. Advantageously, the transforming step is performed by an electrical transformer, such as transformer 412 (FIG. 7). The transforming can be done by piezoelectric transforming. The transforming step will typically and more preferably be done so as to perform by stepping up the voltage differential generated across the piezoelectric unit 205. The stepping up allows a higher output voltage. The stepping up also is preferably impedance matched relative to downstream circuitry which is believed to provide increase efficiency in subsequent conditioning of the electrical output derived from the piezoelectric generating materials 205. Employing higher voltages allows the line voltages developed to more fully overcome losses which occur in the conditioning circuitry.

The transforming step is preferably performed between the generating of the electrical charge in the piezoelectric material and the subsequent conditioning circuitry. For example, the stepping up of the voltage of the generated electrical charge from the piezoelectric units 205 is performed prior to subsequent conditioning of the output. This is more preferably done between the piezo generator unit and any rectification step, such as performed by rectifiers 214 and 368. In such example the boosted voltage provided by the transforming step provide improved efficiency due to reduced losses in the rectifiers. Other downstream components may also demonstrate reduced losses or other efficiency improvements due to the transforming of the voltages produced by the piezoelectric generator unit or units 205.

Methods according to the invention also advantageously include regulating the output voltage supplied from the piezoelectric unit or transformed output from the piezoelectric unit. This is more preferably done between the piezo generator. (multi-layer thin films of piezo materials) and any rectification step.

In one form of the regulating action the output electrical charge flow is rectified in the rectifying step explained hereinabove. It may in certain situations not be necessary to rectify the output from the piezoelectric generator or to regulate or rectify in an alternative manner.

The preferred methods also may include regulation of the output voltage using a filter, such as filter 370, which serves by filtering or smoothing the output voltage from the generator and conditioning circuitry to achieve a more stable voltage level.

Methods according to the invention may further include an active voltage regulation element or elements, such as zener diodes 372 and 378 which serve to keep the output voltage within a range of acceptable voltages defined by the avalanche voltages of the zener diodes.

Methods according hereto may further involve dissipating excessive voltage generated across the charge storage devices to prevent overvoltage conditions, such as using overvoltage protector 377.

As shown, the preferred methods may include one or more of the rectifying, filtering and active voltage regulating steps described above. It may alternatively be suitable to use other forms of output conditioning to provide a desired output voltage pattern in response to the fluctuating voltage typically demonstrated by the output from the piezoelectric generator units 205.

Methods according to this invention may also advantageously include storing the produced electrical charge initially generated from the piezoelectric unit or units 205. This is preferably done after conditioning the output current as explained herein. Alternatively, the storing may occur in some other manner.

The storing is preferably done by charging a storage capacitor, such as storage capacitor 380. Charge is stored by supplying current to an appropriately chosen storage capacitor or capacitors or other electricity storage device. The storing may also be possible in the variant form of charging a battery, such as battery 454. Still further storage may occur first in a storage capacitor or capacitor or other electricity storage device and then be appropriately fed to a battery or other secondary electrical storage device.

The methods according to this invention further may be defined to include discharging stored electrical energy from the storage capacitor, battery or other electrical storage device, alternatively referred to as an electric or electricity store.

It should be appreciated that the method steps described herein may be capable of performance with or without one or more of the preferred manners described herein. Whether such alternative performance is suitable for the efficient operation of the novel methods may vary in the future dependent upon the technology available now and hereafter developed. Accordingly, the invention should be interpreted with a recognition that variations in the combinations of components described above may be useful and within the scope of the invention as described herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A force driven source of electrical power, comprising:
   at least one piezoelectric element comprising lead-magnesium-niobate lead titanate (PMN-PT) configured to generate an electrical charge responsive to an applied stress; and
   circuitry coupled to said at least one piezoelectric element configured to:
   limit voltage of generated electrical charge therefrom;
   rectify electrical charge therefrom;
   regulate voltage of electrical charge therefrom;
   store regulated electrical charge.

2. A force driven source of electrical power in accordance with claim 1 wherein the circuitry is further configured to transform voltage of electrical charge from said at least one piezoelectric element.

3. A force-driven electrical power system, comprising:
   a plurality of piezoelectric elements comprising lead-magnesium-niobate lead titanate (PMN-PT), each such elements configured to generate an electrical charge responsive to an applied stress which simultaneously forces at least two of said piezoelectric elements;
   circuitry coupled to each of the PMN-PT elements configured to:
   limit voltage of generated electrical charge therefrom;
   rectify electrical charge therefrom;
   sum rectified electrical charges therefrom;
   regulate voltage of electrical charge therefrom.

4. A force driven electrical power system in accordance with claim 3 wherein the circuitry is further configured to transform voltage of electrical charge from said piezoelectric elements.

5. A method for producing electrical power, comprising:
   providing at least one piezoelectric element comprising lead-magnesium-niobate lead titanate (PMN-PT);
   providing circuitry coupled to said at least one piezoelectric element;
   applying force to said at least one piezoelectric element;
   generating electrical charge responsive to said applying force;
   limiting voltage across the at least one piezoelectric elements using the circuitry;
   transforming voltage of the electrical charge generated by the at least one piezoelectric element using the circuitry;
   rectifying electrical charge from the at least one piezoelectric element using the circuitry;

regulating voltage of the electrical charge from the at least one piezoelectric element using the circuitry; and storing regulated electrical charge using the circuitry.

6. A method for producing electrical power, comprising:

providing a plurality of piezoelectric elements comprising lead-magnesium-niobate lead titanate (PMN-PT);

providing circuitry coupled to said plurality of piezoelectric elements;

applying a force to said plurality of piezoelectric elements so that force is applied simultaneously through at least two said plurality of piezoelectric elements;

generating electrical charge responsive to said applying a force;

limiting voltage across the plurality of piezoelectric elements using the circuitry;

transforming voltage of charge generated by the plurality of piezoelectric elements using the circuitry;

rectifying electrical charge from the plurality of piezoelectric elements using the circuitry;

summing rectified electrical charge using the circuitry;

regulating voltage of summed electrical charge using the circuitry; and storing regulated electrical charge using the circuitry.

7. A method in accordance with claim 6 and further comprising electrically coupling a battery to the circuitry to deliver at least some stored electrical charge in the battery to a load.

* * * * *